(12) United States Patent
Watanabe et al.

(10) Patent No.: US 9,496,641 B2
(45) Date of Patent: Nov. 15, 2016

(54) ELECTRICAL WIRE PROTECTIVE COVER

(71) Applicant: YAZAKI CORPORATION, Minato-ku, Tokyo (JP)

(72) Inventors: Tetsuya Watanabe, Makinohara (JP); Tomoyuki Kasajima, Tokyo (JP)

(73) Assignee: YAZAKI CORPORATION, Tokyo (JP)

( * ) Notice: Subject to any disclaimer, the term of this patent is extended or adjusted under 35 U.S.C. 154(b) by 22 days.

(21) Appl. No.: 14/543,947

(22) Filed: Nov. 18, 2014

(65) Prior Publication Data
US 2015/0068785 A1    Mar. 12, 2015

Related U.S. Application Data

(63) Continuation of application No. PCT/JP2013/064080, filed on May 21, 2013.

(30) Foreign Application Priority Data

May 22, 2012  (JP) .................................. 2012-116460

(51) Int. Cl.
| | | |
|---|---|---|
| *H01R 13/56* | (2006.01) | |
| *H05K 5/02* | (2006.01) | |

(52) U.S. Cl.
CPC ............ *H01R 13/562* (2013.01); *H01R 13/56* (2013.01); *H05K 5/0247* (2013.01)

(58) Field of Classification Search
USPC .................................. 174/62, 72 A; 439/701
See application file for complete search history.

(56) References Cited

U.S. PATENT DOCUMENTS

| | | | | |
|---|---|---|---|---|
| 6,259,033 B1* | 7/2001 | Kassulat | ................ | H02G 3/088 |
| | | | | 174/151 |
| 7,674,138 B2* | 3/2010 | Mori | ........................ | H02G 3/32 |
| | | | | 439/701 |

FOREIGN PATENT DOCUMENTS

| | | |
|---|---|---|
| CN | 1383596 A | 12/2002 |
| CN | 2646896 Y | 10/2004 |
| JP | S63-051518 A | 3/1988 |
| JP | H04-5058 U | 1/1992 |
| JP | H08-182163 A | 7/1996 |
| JP | H11-219755 A | 8/1999 |

(Continued)

OTHER PUBLICATIONS

Australian office action letter issued on Oct. 7, 2015 in the counterpart Australian patent application.

(Continued)

*Primary Examiner* — Dhirubhai R Patel
(74) *Attorney, Agent, or Firm* — Mots Law, PLLC

(57) ABSTRACT

An electrical wire protective cover is assembled to a connector to cover an electrical wire pulled out of the connector. The electrical wire protective cover includes: a cover body configured to receive the electrical wire and having a wire receiving channel with an opening along a wire extending direction of the electrical wire; and a temporary wire retaining piece protruding from the cover body in a direction narrowing the opening of the wire receiving channel, and configured to allow the electrical wire to be inserted by a bending deformation of the temporary wire retaining piece into an inside of the wire receiving channel and prevent a movement of the electrical wire received in the wire receiving channel to an outside of the wire receiving channel.

20 Claims, 20 Drawing Sheets

(56) References Cited

FOREIGN PATENT DOCUMENTS

| JP | 2005-026048 A | 1/2005 |
| JP | 2011-082113 A | 4/2011 |
| JP | 2011-090944 A | 5/2011 |
| JP | 2011-222251 A | 11/2011 |
| JP | 2012-028138 A | 2/2012 |

OTHER PUBLICATIONS

Japanese office action letter issued on Nov. 17, 2015 in the counterpart Japanese patent application.
Chinese Office Action issued on Dec. 29, 2015 in the counterpart Chinese patent application.
Chinese Office Action issued on Jun. 17, 2016 in the counterpart Chinese patent application.

\* cited by examiner

ELECTRICAL WIRE PROTECTIVE COVER

CROSS REFERENCE TO RELATED APPLICATION

This application is a Continuation of PCT Application No. PCT/JP2013/064080, filed on May 21, 2013, and claims the priority of Japanese Patent Application No. 2012-116460, filed on May 22, 2012, the content of both of which is incorporated herein by reference.

BACKGROUND

1. Technical Field

The present invention relates to an electrical wire protective cover that is assembled to a connector and covers an electrical wire pulled out of the connector.

2. Related Art

Japanese Unexamined Patent Application Publication No. 63-51518 and Japanese Unexamined Patent Application Publication No. 8-182163 propose an electrical wire protective cover. Japanese Unexamined Patent Application Publication No. 2005-26048 proposes an electrical wire protective cover that is assembled to a connector and covers an electrical wire pulled out of the connector. An example of such an electrical wire protective cover is shown in FIGS. 1 to 5.

In FIGS. 1 to 5, a connector 110 to which an electrical wire protective cover 100 is assembled includes a connector housing 111 and a plurality of terminals 112 received in the connector housing 111. Electrical wires W are connected to the terminals 112. The electrical wires W are pulled out of the rear of the connector housing 111.

The electrical wire protective cover 100 is assembled to the rear side of the connector housing 111. The electrical wire protective cover 100 has a cover body 101 that covers the rear of the connector housing 111 and extends in a wire extending direction and a connector assembling portion 102 provided on one end side of the cover body 101. The cover body 101 is generally semi-cylindrical in shape and has a wire receiving channel 104 therein. The wire receiving channel 104 has an opening 104a along the wire extending direction. An opening size D of the opening 104a is set to be as wide as the maximum width of the wire receiving channel 104. That is, the opening size D is wider than the width of the electrical wires W bundled.

In order to assemble the electrical wire protective cover 100 to the connector 110, the electrical wires W are inserted into the wire receiving channel 104 of the electrical wire protective cover 100 through the opening 104a. Then the connector assembling portion 102 of the electrical wire protective cover 100 receiving the electrical wires W is fitted to the rear side of the connector housing 111 and the assembly is completed.

In the electrical wire protective cover 100, the opening 104a of the wire receiving channel 104 has the opening size D wider than the width of the electrical wires W as shown in FIG. 5, so that the electrical wires W can be easily inserted.

SUMMARY

However, since the opening 104a of the wire receiving channel 104 has the opening size D wider than the width of the bundled electrical wires W in the electrical wire protective cover 100 as shown in FIG. 5, the electrical wire protective cover 100 is easily removed from the electrical wires W in the direction of an arrow Y1 in an assembling process. This lowers assembling workability of the electrical wire protective cover 100.

An object of the present invention is to provide an electrical wire protective cover contributing to higher workability of assembly to a connector.

An electrical wire protective cover in accordance with some embodiments is assembled to a connector and covers an electrical wire pulled out of the connector. The electrical wire protective cover includes: a cover body configured to receive the electrical wire and having a wire receiving channel with an opening along a wire extending direction of the electrical wire; and a temporary wire retaining piece protruding from the cover body in a direction narrowing the opening of the wire receiving channel, and configured to allow the electrical wire to be inserted by a bending deformation of the temporary wire retaining piece into an inside of the wire receiving channel and prevent a movement of the electrical wire received in the wire receiving channel to an outside of the wire receiving channel.

A pair of the temporary wire retaining pieces may be provided on the cover body.

The temporary wire retaining piece may be provided on one side of the cover body.

The pair of the temporary wire retaining pieces may interfere with each other in a bending deformation to the outside of the wire receiving channel from the wire receiving channel.

The pair of the temporary wire retaining pieces may have respective engagement portions at distal ends of the pair of the temporary wire retaining pieces and be configured to interfere with each other due to an engagement between the engagement portions in the bending deformation to the outside of the wire receiving channel from the wire receiving channel.

The single temporary wire retaining piece may be configured to interfere with the cover body in a bending deformation to the outside of the wire receiving channel from the wire receiving channel.

The temporary wire retaining piece may slope in a direction entering the inside of the wire receiving channel.

The temporary wire retaining piece may have a rounded surface defined as an outer surface of a connecting portion to the cover body.

The temporary wire retaining piece may have a tapered surface where an end portion of the temporary wire retaining piece in the wire extending direction of the electrical wire gradually expands an opening toward a tip of the temporary wire retaining piece.

According to the configuration described above, when a temporary wire retaining piece is pressed in order to receive an electrical wire in the wire receiving channel, the temporary wire retaining piece undergoes bending deformation toward the inside of the wire receiving channel and the wire can be received in the wire receiving channel. When the electrical wire has been received in the wire receiving channel, the temporary wire retaining piece returns to an original position by return movement, and the electrical wire protective cover is temporarily engaged with the electrical wire. This prevents the electrical wire protective cover from being easily removed from the electrical wire, thus increasing workability of assembly to a connector.

DETAILED DESCRIPTION

Figure 1:
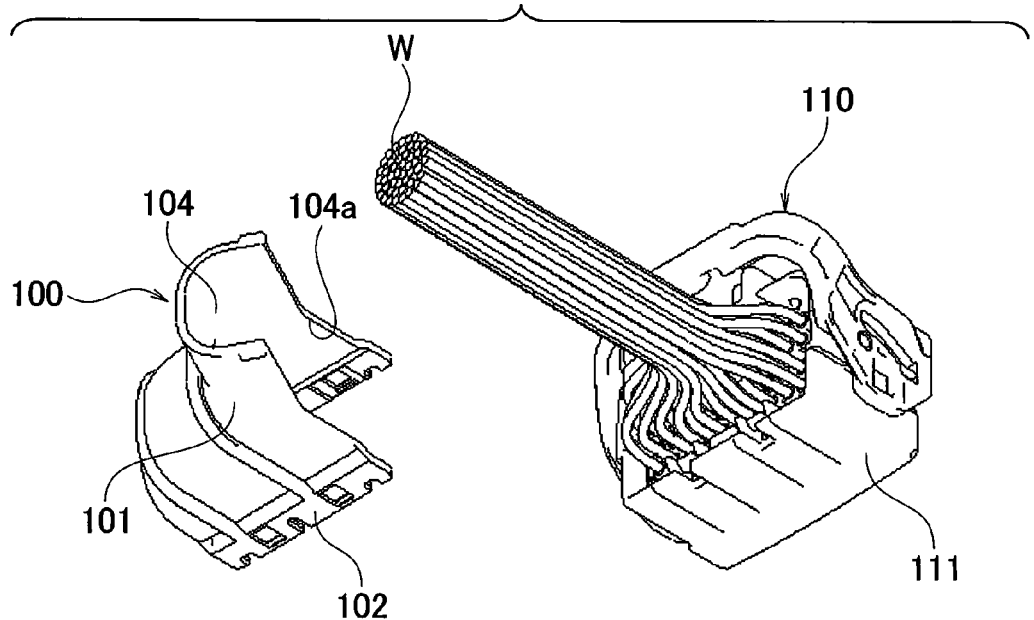
FIG. 1 is a perspective view of an electrical wire protective cover and a connector prior to assembly according to a related example.
Figure 2:
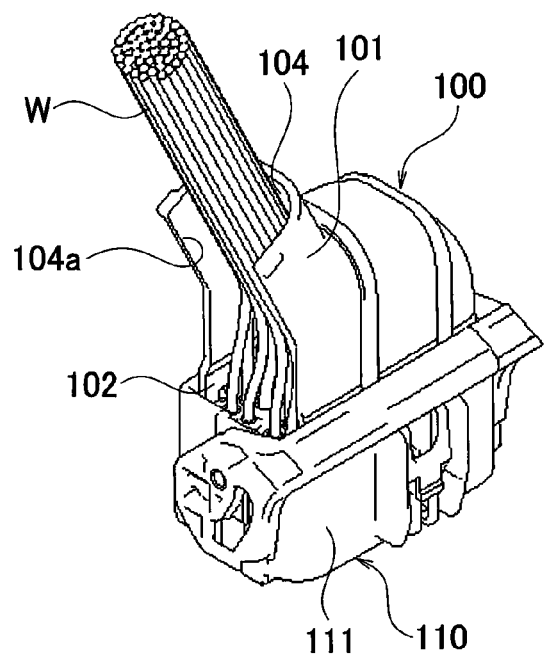
FIG. 2 is a perspective view of the electrical wire protective cover and the connector in an assembled state according to the related example.
Figure 3:
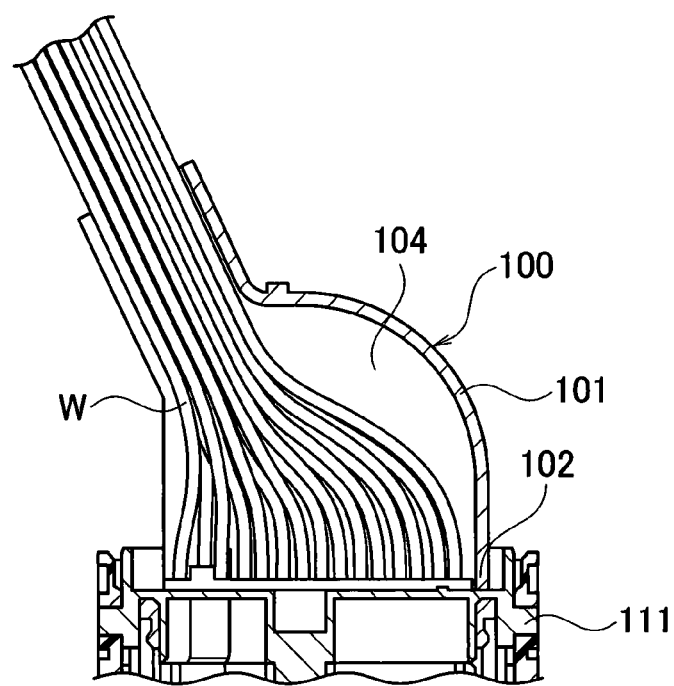
FIG. 3 is a cross-sectional view of the electrical wire protective cover and the connector in the assembled state according to the related example.
Figure 4:
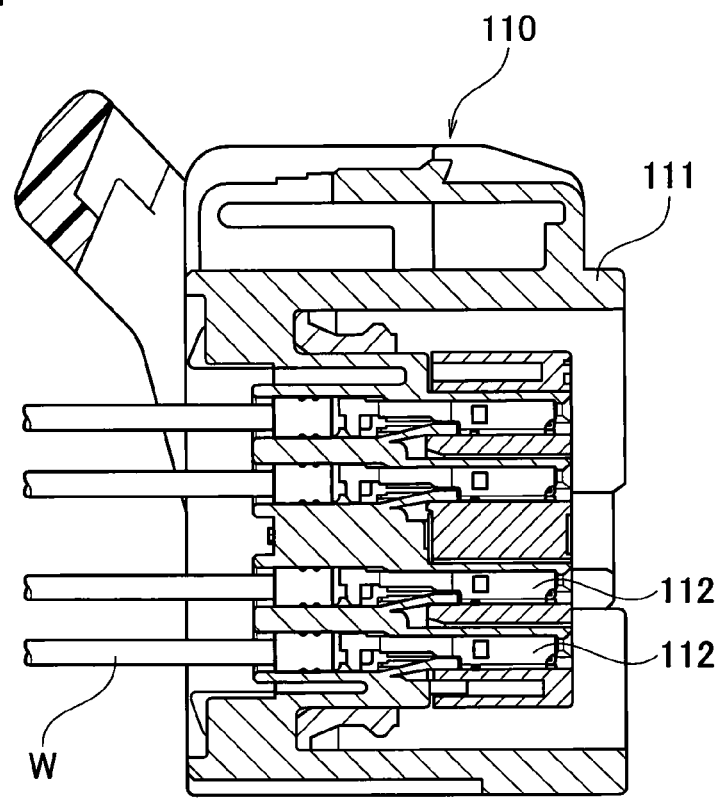
FIG. 4 is a cross-sectional view of the connector according to the related example.
Figure 5:
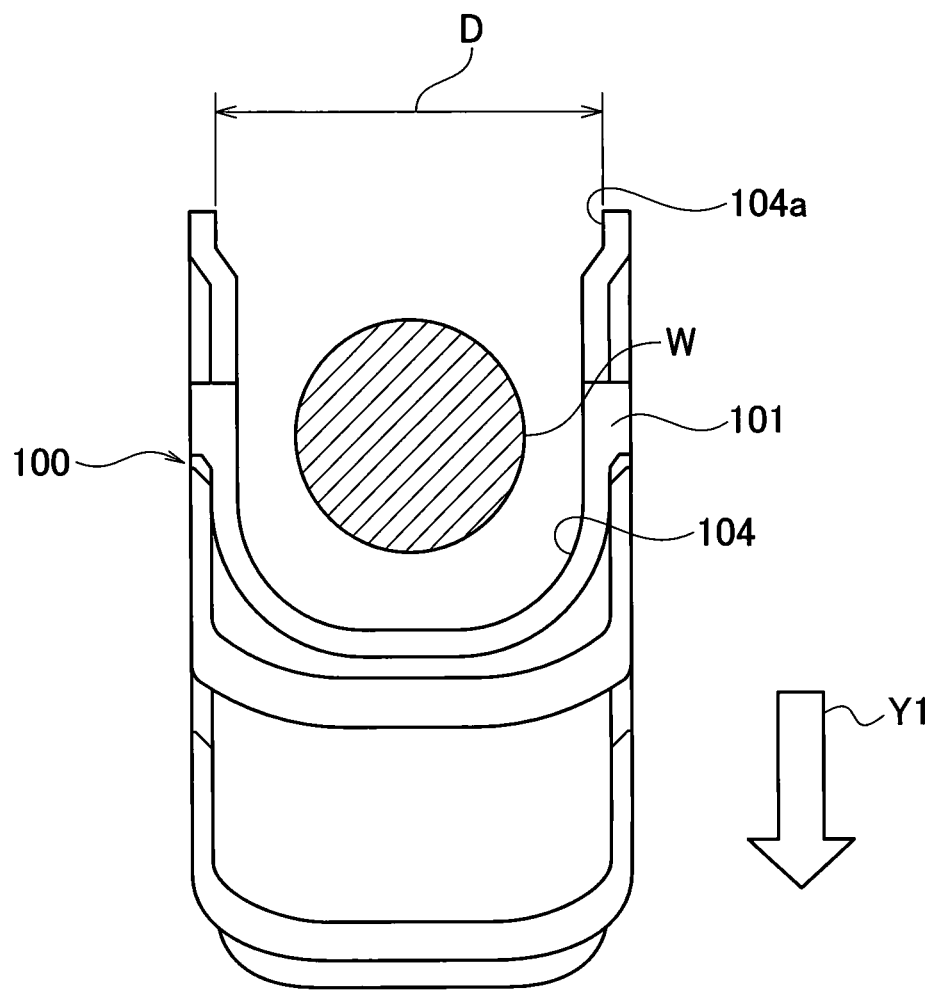
FIG. 5 is a side view showing that electrical wires are easily removed from the electrical wire protective cover according to the related example.
Figure 6:
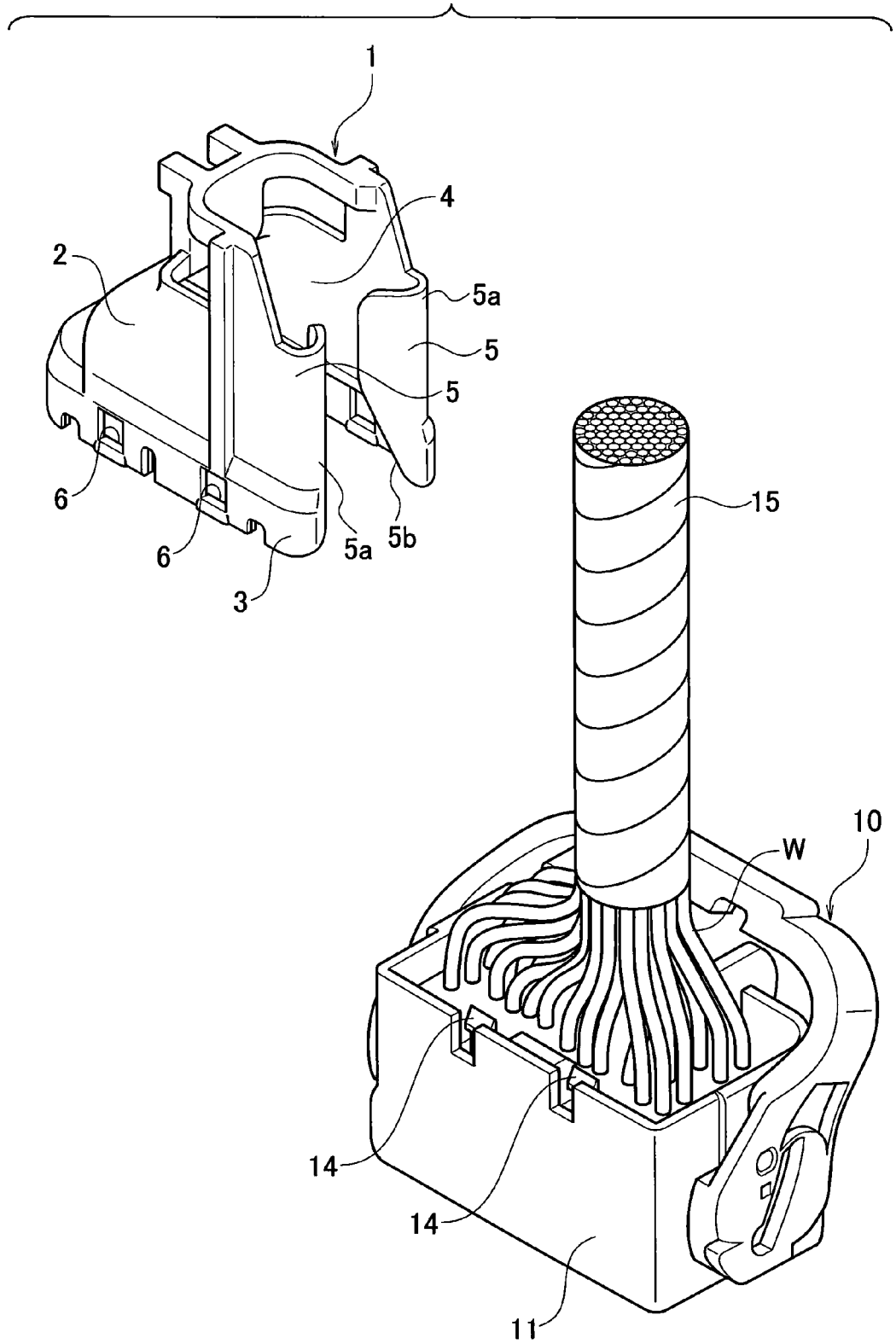
FIG. 6 is a perspective view of an electrical wire protective cover and a connector prior to assembly according to a first embodiment of the present invention.
Figure 7:
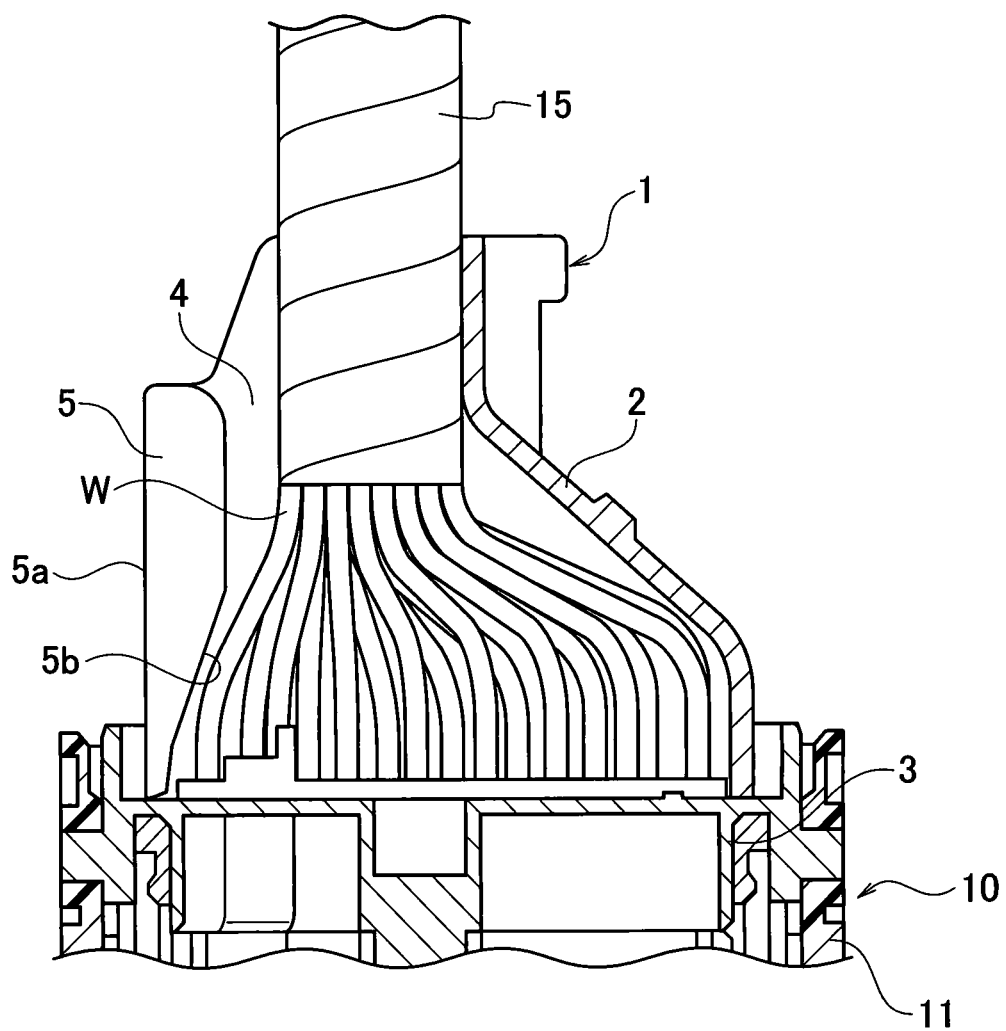
FIG. 7 is a cross-sectional view of the electrical wire protective cover and the connector in an assembled state according to the first embodiment of the present invention.
Figure 8:
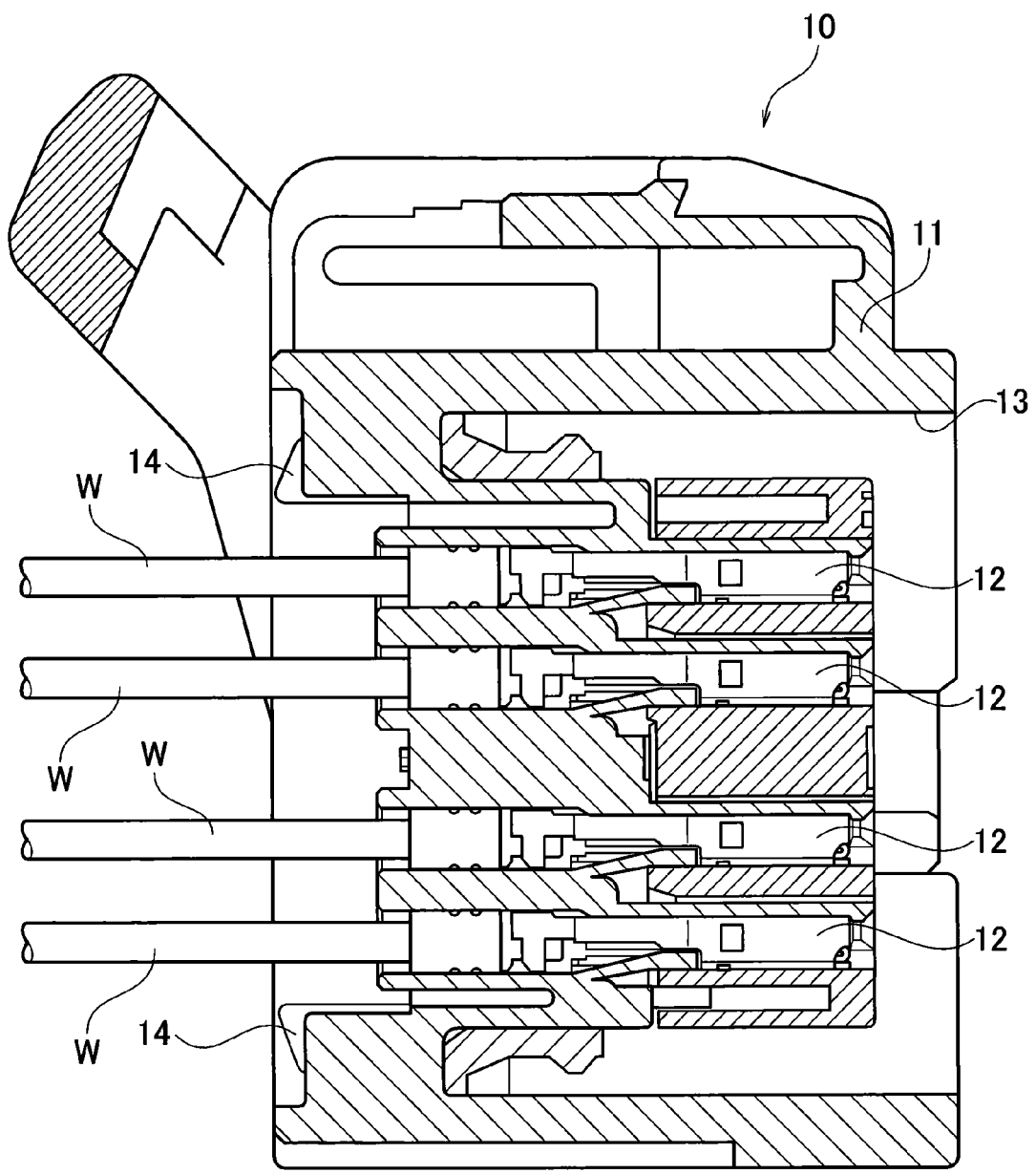
FIG. 8 is a cross-sectional view of the connector according to the first embodiment of the present invention.
Figure 9:
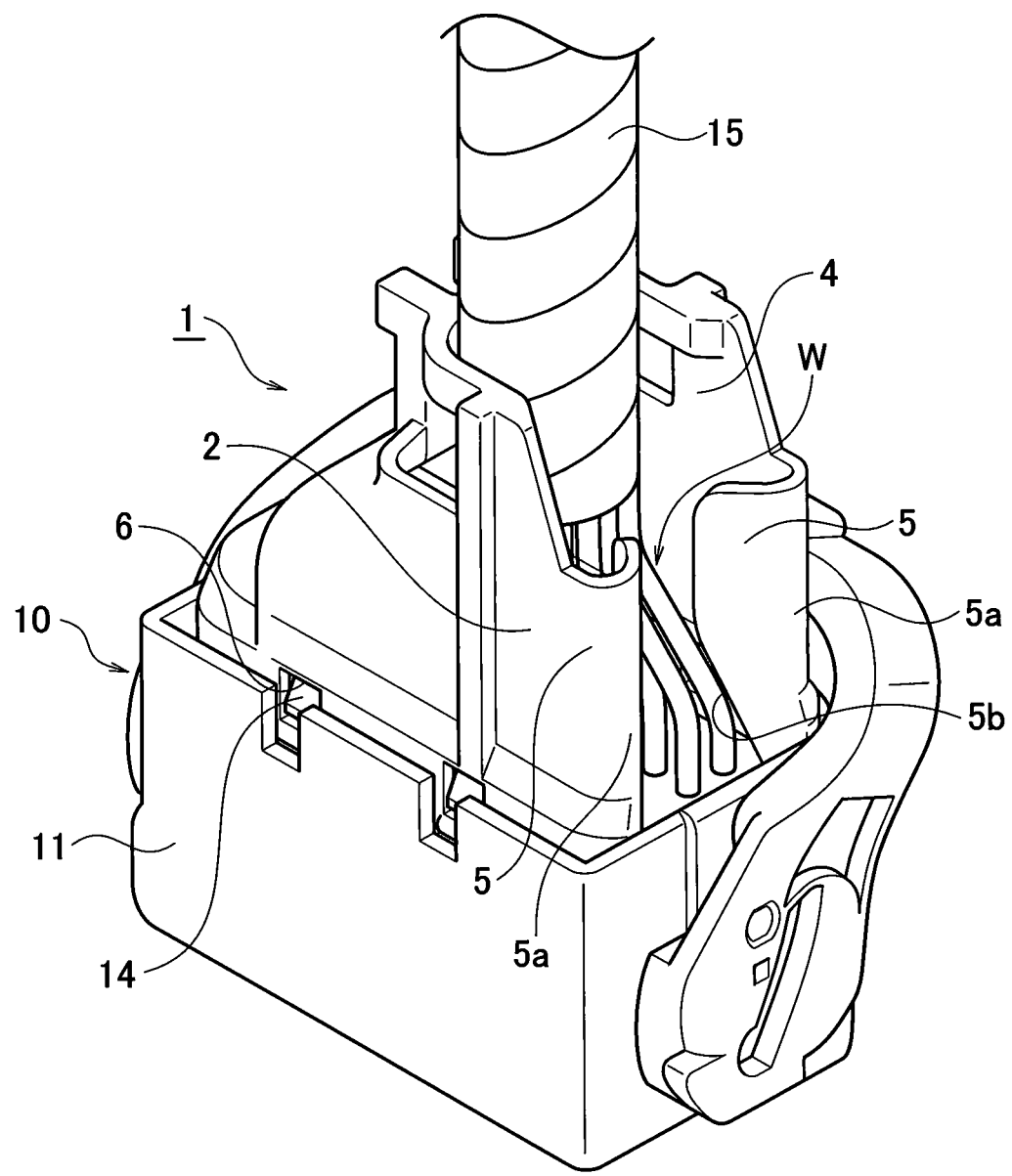
FIG. 9 is a perspective view of a main part showing a state in which electrical wires are received in the electrical wire protective cover according to the first embodiment of the present invention.
Figure 10:
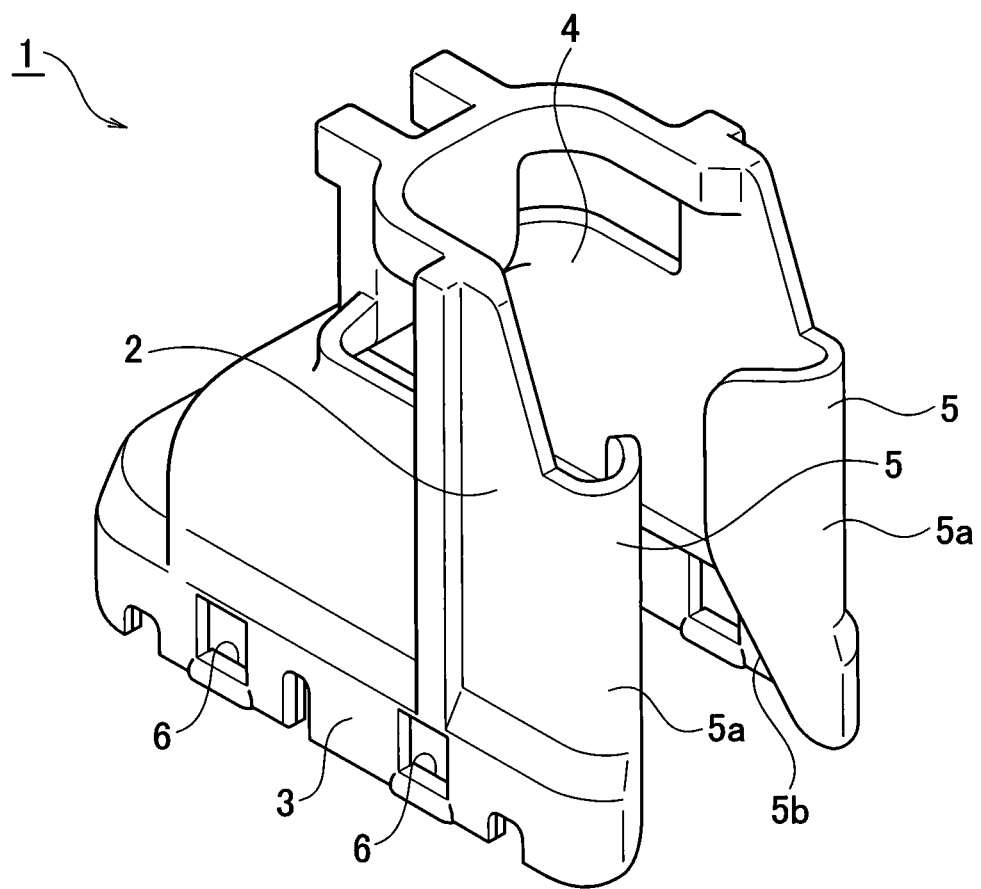
FIG. 10 is a perspective view of the electrical wire protective cover according to the first embodiment of the present invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Embodiments of the present invention will now be described with reference to the drawings.

First Embodiment

FIGS. 6 to 11C show a first embodiment of the present invention. In FIGS. 6 to 10, a connector 10 to which an electrical wire protective cover 1 is assembled includes a connector housing 11 and a plurality of terminals 12 received in the connector housing 11. The front of the connector housing 11 is provided with a mating opening 13 for a mating connector (not shown). The terminals 12 are received in the connector housing 11 such that the terminals 12 face the mating opening 13. The end portion of an electrical wire W is connected to each of the terminals 12. The rear side of the connector housing 11 is formed so as to fit to a connector assembling portion 3 of the electrical wire protective cover 1. The rear side of the connector housing 11 formed in such a manner is provided with a plurality of engagement claws 14. A plurality of electrical wires W are pulled out of the rear side of the connector housing 11. A retaining tape 15 is wound onto the electrical wires W pulled out of the connector housing 11, thereby bundling the electrical wires W. For convenience of explanation, the electrical wires W bundled are referred to just as an electrical wire W in the following description.

The electrical wire protective cover 1 is assembled to the rear side of the connector housing 11. The electrical wire protective cover 1 has a cover body 2 that covers the rear of the connector housing 11 and extends in a wire extending direction and a connector assembling portion 3 provided on one end side of the cover body 2.

The cover body 2 is generally semi-cylindrical in shape. The cover body 2 has a wire receiving channel 4 therein opened along the wire extending direction. The cover body 2 is laterally provided with a pair of temporary wire retaining pieces 5.

The pair of temporary wire retaining pieces 5 protrude in a direction that narrows the opening of the wire receiving channel 4. Thus, a dimension D1 of an opening 4a of the wire receiving channel 4 is set smaller than the width of the electrical wire W to be received. The pair of temporary wire retaining pieces 5 slope in a direction that enters the inside of the wire receiving channel 4. Accordingly, each of the temporary wire retaining pieces 5, which is formed to gradually enter the inside of the wire receiving channel 4 from its root toward its tip, is configured to guide the electrical wire W into the opening 4a of the wire receiving channel 4.

The pair of temporary wire retaining pieces 5 allow the electrical wire W to be inserted by inward bending deformation into the wire receiving channel 4 and prevents outward movement of the electrical wire W received in the wire receiving channel 4.

Each of the temporary wire retaining piece 5 has a rounded surface 5a that is formed on the outer surface of a connecting portion to the cover body 2. The temporary wire retaining piece 5 has a tapered surface 5b where one end portion in the wire extending direction gradually expands the opening 4a toward its tip.

The connector assembling portion 3 is provided with a plurality of engagement holes 6.

Figure 11A:
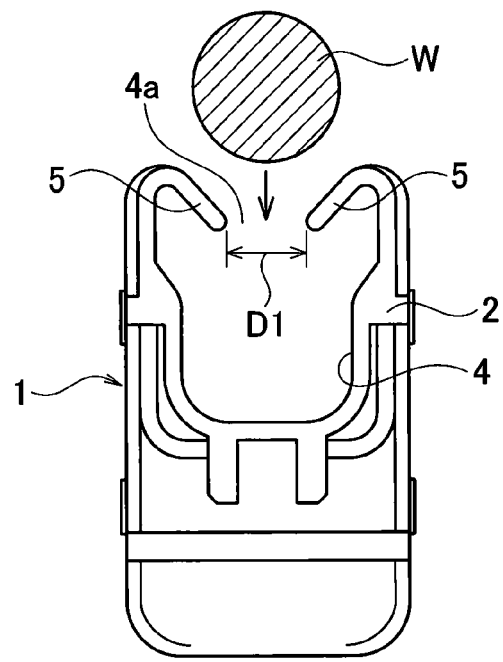
FIG. 11A is a side view of the electrical wire protective cover according to the first embodiment of the present invention.
Figure 11B:
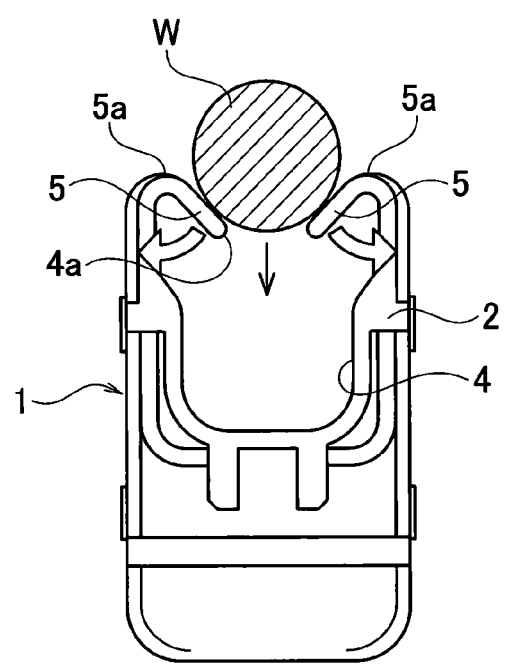
FIG. 11B is a side view showing a process for receiving the electrical wires in the electrical wire protective cover according to the first embodiment of the present invention.

In the following, assembling of the electrical wire protective cover 1 to the connector 10 will be briefly described. As shown in FIG. 11A, the electrical wire W is inserted into the wire receiving channel 4 through the opening 4a. Then the electrical wire W abuts on the pair of temporary wire retaining pieces 5 as illustrated in FIG. 11B. When the electrical wire W is further pressed than as illustrated in FIG. 11B for insertion into the wire receiving channel 4, the pair of temporary wire retaining pieces 5 undergo bending deformation toward the inside of the wire receiving channel 4 and the electrical wire W is received in the wire receiving channel 4. When the electrical wire W is received in the wire receiving channel 4, the pair of temporary wire retaining pieces 5 return to an original position by return movement. Thus, the dimension D1 of the opening 4a between the pair of temporary wire retaining pieces 5 becomes smaller than the width of the electrical wire W. Finally, the connector assembling portion 3 is aligned and fitted to the rear side of the connector housing 11. This engages the engagement holes 6 with the engagement claws 14, respectively. Now, the assembly is completed.

Figure 11C:
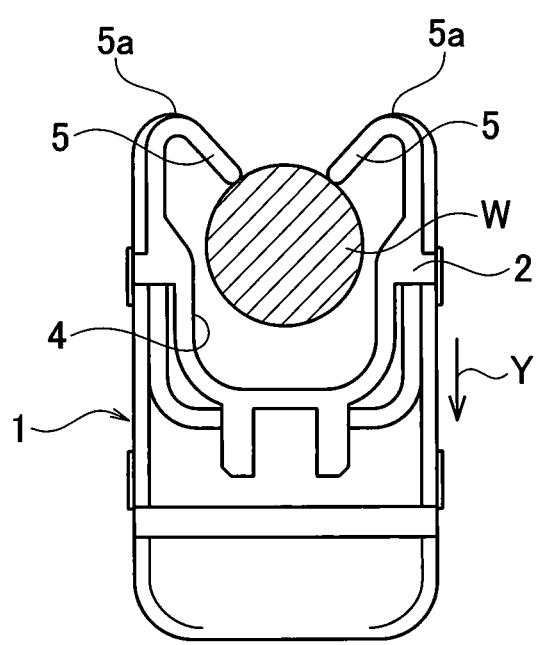
FIG. 11C is a side view showing a state in which temporary wire engaging pieces prevent the electrical wires received in the electrical wire protective cover from moving outside according to the first embodiment of the present invention.
Figure 12:
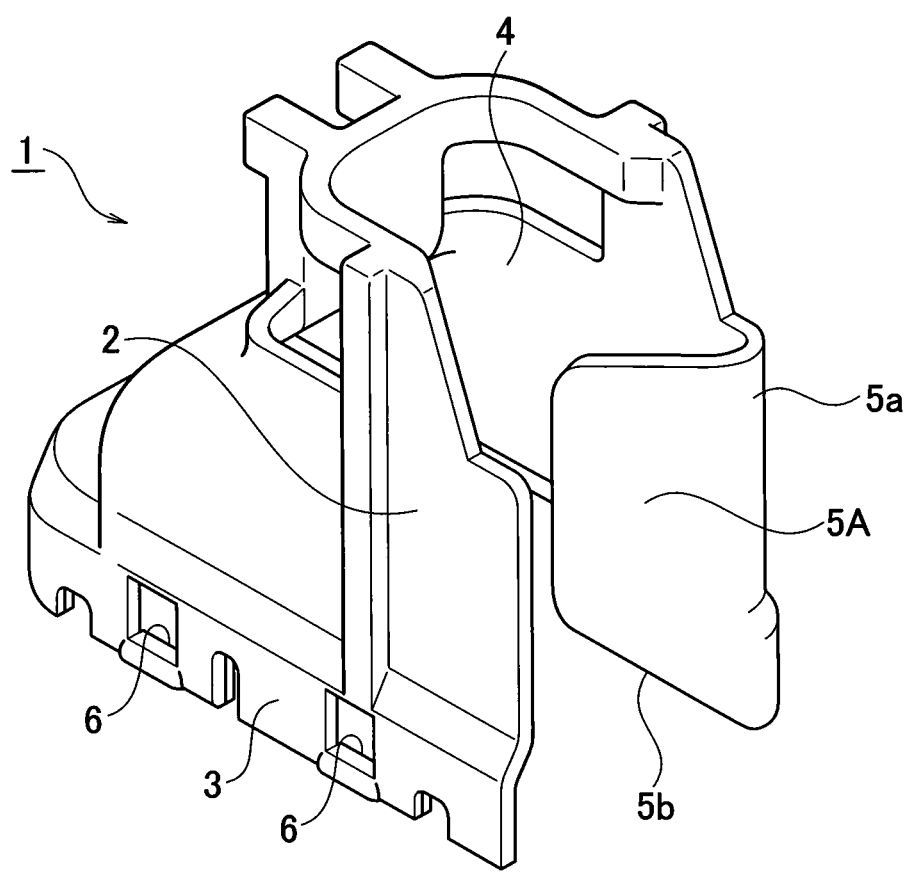
FIG. 12 is a perspective view of an electrical wire protective cover according to a second embodiment of the present invention.

When the electrical wire W is received in the wire receiving channel 4 in the assembling process, the electrical wire protective cover 1 is temporarily engaged with the electrical wire W and it is not easily removed from the electrical wire W since the dimension D1 of the opening 4a between the pair of temporary wire retaining pieces 5 is smaller than the width of the electrical wire W as illustrated in FIG. 11C. Thus, the workability of assembly to the connector 10 is increased.

The pair of temporary wire retaining pieces 5 are provided on both sides of the cover body 2. Thus, even if an insertion position of the electrical wire W is somewhat laterally displaced from the proper position, the electrical wire W abuts on one of the temporary wire retaining pieces 5, which undergoes bending deformation, so that the electrical wire W is can be inserted.

The pair of temporary wire retaining pieces 5 slope in a direction that enters the inside of the wire receiving channel 4. Therefore, even if the insertion position of the electrical wire W is somewhat displaced from the opening 4a when the electrical wire W is inserted into the electrical wire protective cover 1, the electrical wire W is guided to the position of the opening 4a by the temporary wire retaining pieces 5 and insertion workability of the electrical wire W is increased.

The temporary wire retaining piece 5 has a rounded surface 5a that is formed on the outer surface of a connecting portion to the cover body 2. As such, when the electrical wire W is inserted into the electrical wire protective cover 1, a situation where the electrical wire W is damaged by abutment of the electrical wire W on an edge can be avoided as much as possible.

The end portion of the wire extending direction of the temporary wire retaining piece 5 is provided with the tapered surface 5b that is directed to gradually expand the opening 4a from the center toward the tip. Thus, inserting the electrical wire W through the opening 4a at the end portion of the temporary wire retaining pieces 5 in advance allows the electrical wire W to be easily guided into the wire receiving channel 4, thereby improving insertion workability of the electrical wire W.

Since the pair of temporary wire retaining pieces 5 are configured to narrow the dimension D1 of the opening 4a of the wire receiving channel 4, waterproofness and dustproofness of the electrical wire protective cover 1 are improved.

Second Embodiment

FIG. 12 and FIGS. 13A to 13C illustrate a second embodiment of the present invention. The second embodiment is different from the first embodiment in the configuration of a temporary wire retaining piece 5A.

That is, as shown in FIG. 12 and FIGS. 13A to 13C, the cover body 2 is provided with only a single temporary wire retaining piece 5A. The single temporary wire retaining piece 5A slopes and protrudes in a direction that narrows the opening of the wire receiving channel 4 and in a direction that enters the inside of the wire receiving channel 4.

Other configurations are similar to those of the first embodiment and descriptions thereof are omitted. For clarity, identical reference numerals denote the same elements throughout the several views.

Figure 13A:
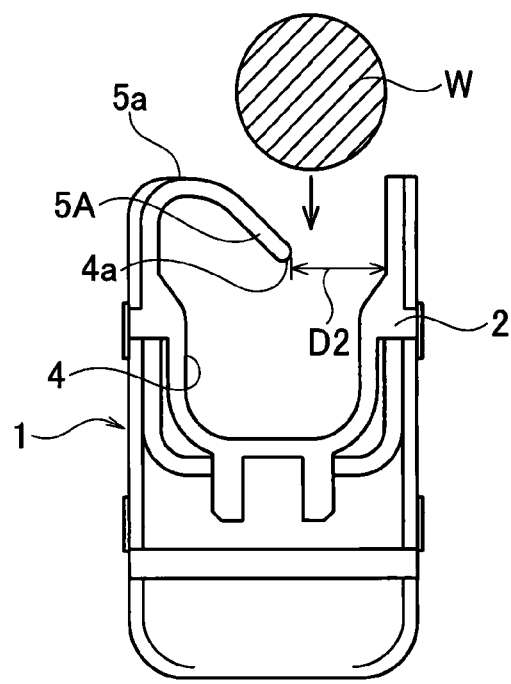
FIG. 13A is a side view of the electrical wire protective cover according to the second embodiment of the present invention.
Figure 13B:
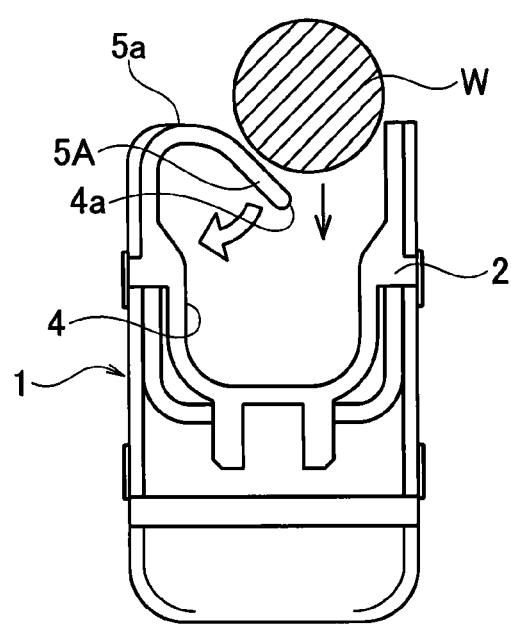
FIG. 13B is a side view showing a process for receiving electrical wires in the electrical wire protective cover according to the second embodiment of the present invention.
Figure 13C:
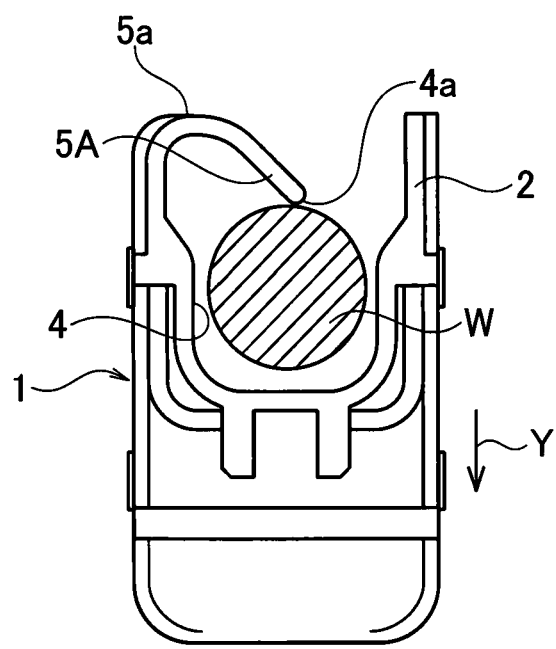
FIG. 13C is a side view showing a state in which a temporary wire engaging piece prevents the electrical wires received in the electrical wire protective cover from moving outside according to the second embodiment of the present invention.

Assembling the electrical wire protective cover 1 to the connector 10 will be briefly described. As shown in FIG. 13A, the electrical wire W is inserted into the wire receiving channel 4 through the opening 4a. Then the electrical wire W abuts on the temporary wire retaining piece 5A as illustrated in FIG. 13B. When the electrical wire W is further pressed than as illustrated in FIG. 13B for insertion into the wire receiving channel 4, the temporary wire retaining piece 5A undergoes bending deformation toward the inside of the wire receiving channel 4 and the electrical wire W is received in the wire receiving channel 4. When the electrical wire W is received in the wire receiving channel 4, the temporary wire retaining piece 5A returns to an original position by return movement. Thus, a dimension D2 of the opening 4a between the single temporary wire retaining piece 5A and the cover body 2 becomes smaller than the width of the electrical wire W. Finally, the connector assembling portion 3 is aligned and fitted to the rear side of the connector housing, and thus the assembly is completed.

When the electrical wire W is received in the wire receiving channel 4 in the assembling process, the electrical wire protective cover 1 is temporarily engaged with the electrical wire W and it is not easily removed from the electrical wire W since the dimension D2 of the opening 4a between the single temporary wire retaining piece 5A and the cover body 2 is smaller than the width of the electrical wire W as shown in FIG. 12C. The workability of assembly to the connector is therefore increased.

Third Embodiment

Figure 14A:
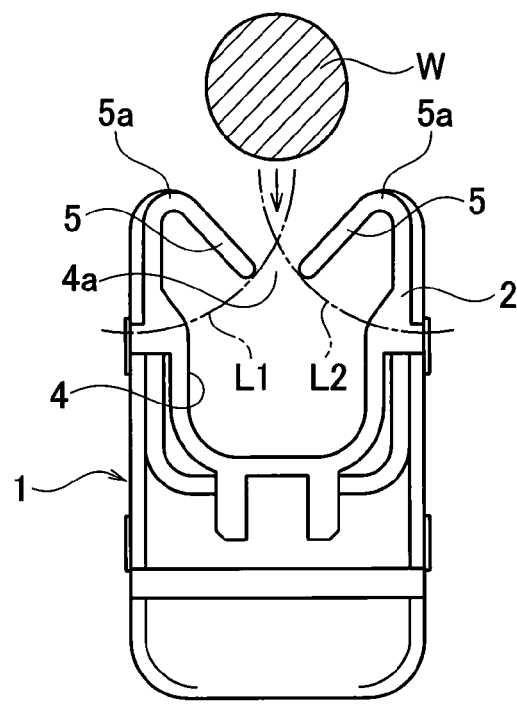
FIG. 14A is a side view of an electrical wire protective cover according to a third embodiment of the present invention.
Figure 14B:
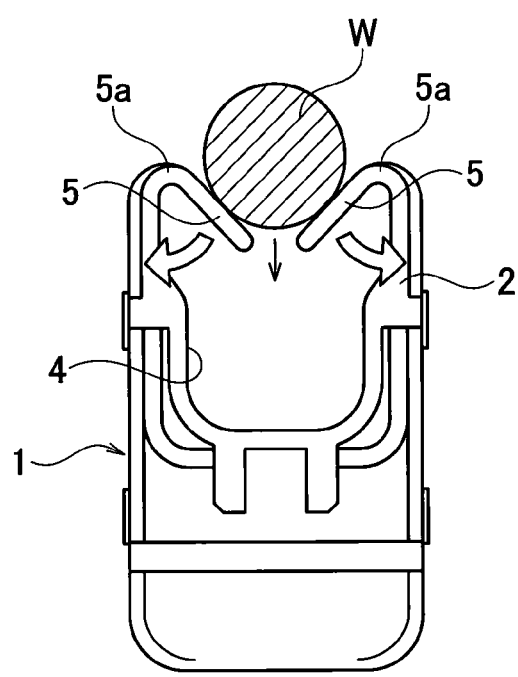
FIG. 14B is a side view showing a process for receiving electrical wires in the electrical wire protective cover according to the third embodiment of the present invention.
Figure 14C:
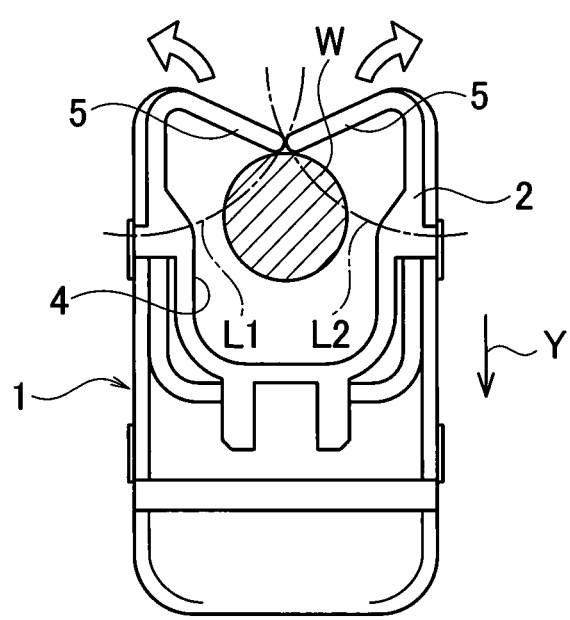
FIG. 14C is a side view showing a state in which temporary wire engaging pieces prevent the electrical wires received in the electrical wire protective cover from moving outside according to the third embodiment of the present invention.

FIGS. 14A to 14C illustrates a third embodiment of the present invention. The third embodiment is different from the first embodiment only in part of the configuration of a pair of temporary wire retaining pieces 5.

That is, as shown in FIGS. 14A to 14C, the pair of temporary wire retaining pieces 5 are configured such that they interfere with each other during the outward bending deformation process from within the wire receiving channel 4 and are prevented from producing bending deformation greater than a certain extent. FIGS. 14A and 14C shows distal end trajectories L1 and L2 when the pair of temporary wire retaining pieces 5 undergo bending deformation, where the temporary wire retaining pieces 5 are configured such that both the distal end trajectories L1 and L2 intersect during the outward bending deformation process.

Since other configurations are similar to those of the first embodiment, the same elements are denoted by the same reference numerals and descriptions thereof are omitted.

In the third embodiment, even if an external force that causes the electrical wire W received in the wire receiving channel 4 to produce outward bending deformation on the pair of temporary wire retaining pieces 5 is applied, the pair of temporary wire retaining pieces 5 interfere with each other and are not allowed to produce bending deformation more than a certain extent as shown in FIG. 14C, so that the electrical wire protective cover 1 is prevented from removing from the electrical wire W. Thus, the workability of assembly to the connector is further increased.

Fourth Embodiment

Figure 15A:
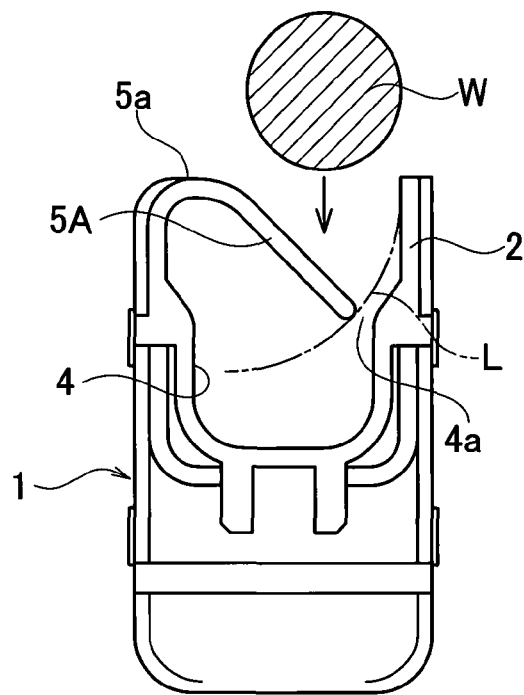
FIG. 15A is a side view of an electrical wire protective cover according to a fourth embodiment of the present invention.
Figure 15B:
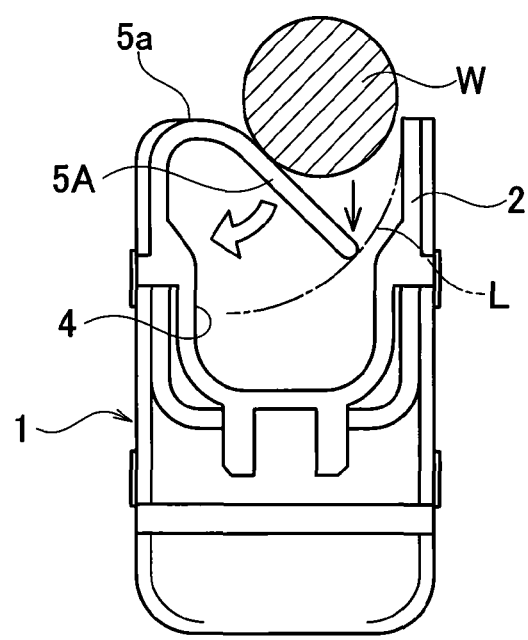
FIG. 15B is a side view showing a process for receiving electrical wires in the electrical wire protective cover according to the fourth embodiment of the present invention.
Figure 15C:
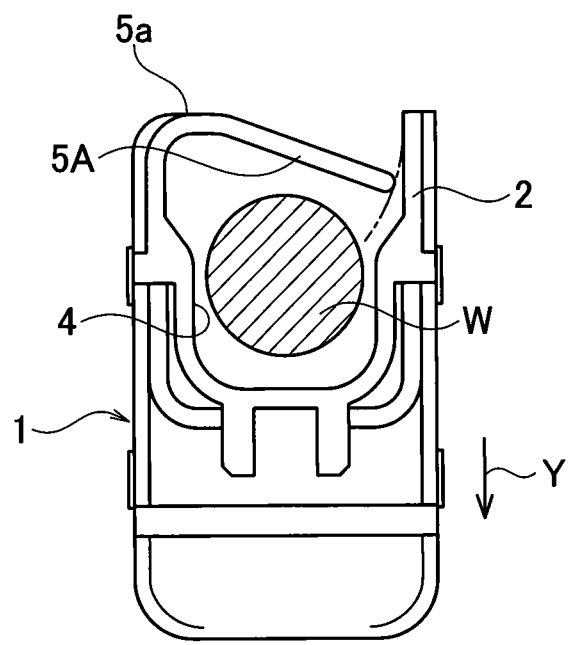
FIG. 15C is a side view showing a state in which a temporary wire engaging piece prevents the electrical wires received in the electrical wire protective cover from moving outside according to the fourth embodiment of the present invention.

FIGS. 15A to 15C illustrate a fourth embodiment of the present invention. The fourth embodiment is different from the second embodiment only in part of the configuration of a single temporary wire retaining piece 5A.

That is, as shown in FIGS. 15A to 15C, the single temporary wire retaining piece 5A is configured such that bending deformation greater than a certain extent is prevented by abutment on the inner surface of the cover body 2 during the outward bending deformation process from within the wire receiving channel 4. FIGS. 15A and 15C show a distal end trajectory L when the single temporary wire retaining piece 5A undergoes bending deformation, where the temporary wire retaining piece 5A are configured such that the distal end trajectory L intersects with the inner surface of the cover body 2 during the outward bending deformation process.

Since other configurations are similar to those of the first embodiment, the same elements are denoted by the same reference numerals and descriptions thereof are omitted.

In the fourth embodiment, even if an external force that causes the electrical wire W received in the wire receiving channel 4 to produce outward bending deformation on the single temporary wire retaining piece 5A is applied, the single temporary wire retaining piece 5A interferes with the inner surface of the cover body 2 and is not allowed to produce bending deformation more than a certain extent as shown in FIG. 15C, so that the electrical wire protective cover 1 is prevented from removing from the electrical wire W. Thus, the workability of assembly to the connector is further increased.

Fifth Embodiment

FIG. 16 and FIGS. 17A to 17C illustrate a fifth embodiment of the present invention. The fifth embodiment is different from the first embodiment only in part of the configuration of a pair of temporary wire retaining pieces 5B.

Figure 16:
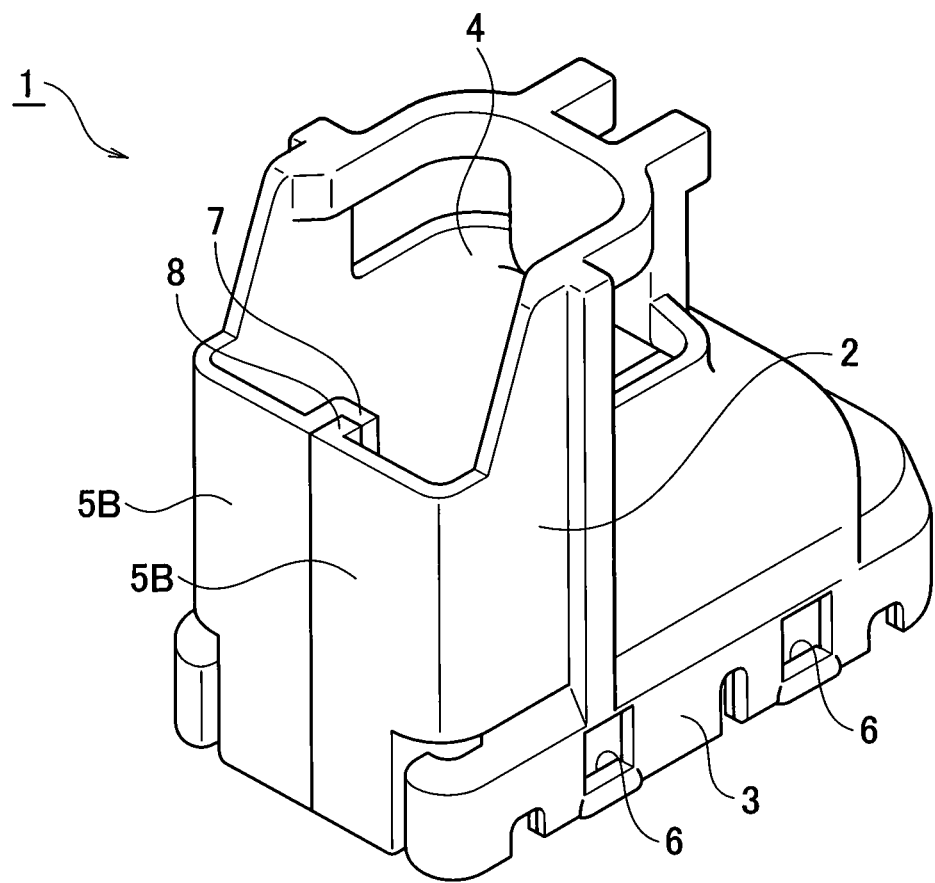
FIG. 16 is a perspective view of an electrical wire protective cover according to a fifth embodiment of the present invention.
Figure 17A:
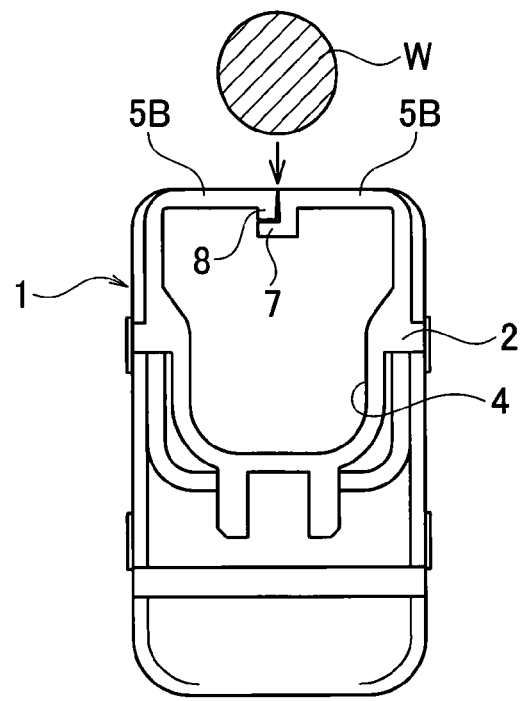
FIG. 17A is a side view of the electrical wire protective cover according to the fifth embodiment of the present invention.

That is, as shown in FIGS. 16 and 17A, the pair of temporary wire retaining pieces 5B have engagement portions 7 and 8 at their distal ends. The pair of engagement portions 7 and 8 are disposed in a position where they are engaged with each other, prior to bending deformation of the pair of temporary wire retaining pieces 5B. Thus, the wire receiving channel 4 is completely closed along the wire extending direction. The pair of engagement portions 7 and 8 prevent the pair of temporary wire retaining pieces 5B from moving outside of the wire receiving channel 4 by engaging with each other. When the pair of temporary wire retaining pieces 5B are moved into the wire receiving channel 4, the engagement of the pair of engagement portions 7 and 8 is released and the pair of temporary wire retaining pieces 5B are gradually opened. This allows the electrical wire W to be inserted.

Since other configurations are similar to those of the first embodiment, the same elements are denoted by the same reference numerals and descriptions thereof are omitted.

Figure 17B:
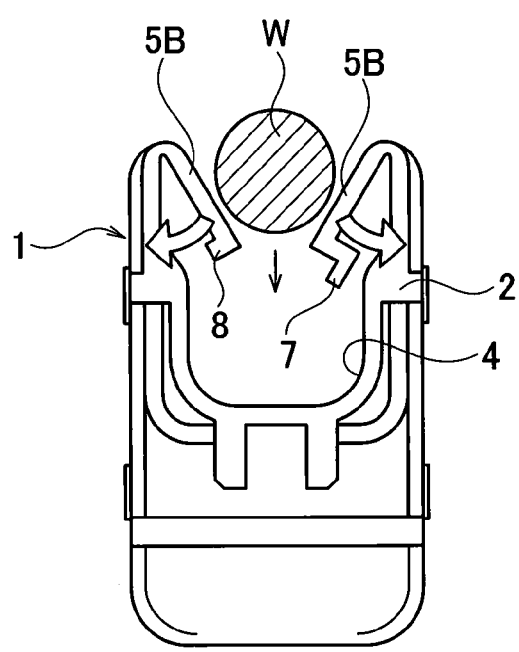
FIG. 17B is a side view showing a process for receiving electrical wires in the electrical wire protective cover according to the fifth embodiment of the present invention.

As shown in FIG. 17A, the pair of temporary wire retaining pieces 5B are pressed at its tip position from the outside by the electrical wire W in order to insert the electrical wire W into the wire receiving channel 4. Then, as shown in FIG. 17B, the electrical wire W abuts on the tip portion of the pair of temporary wire retaining pieces 5B. When the electrical wire W is further pressed than as illustrated in FIG. 17B for insertion into the wire receiving channel 4, the pair of temporary wire retaining pieces 5B undergo bending deformation toward the inside of the wire receiving channel 4 and the electrical wire W is received in the wire receiving channel 4. When the electrical wire W is received in the wire receiving channel 4, the pair of temporary wire retaining pieces 5B return to the original position by return movement. Thus, the opening between the pair of temporary wire retaining pieces 5B is completely closed. Finally, the connector assembling portion is aligned and fitted to the rear side of the connector housing. This engages the engagement holes with the engagement claws, respectively. Now, the assembly is completed.

Figure 17C:
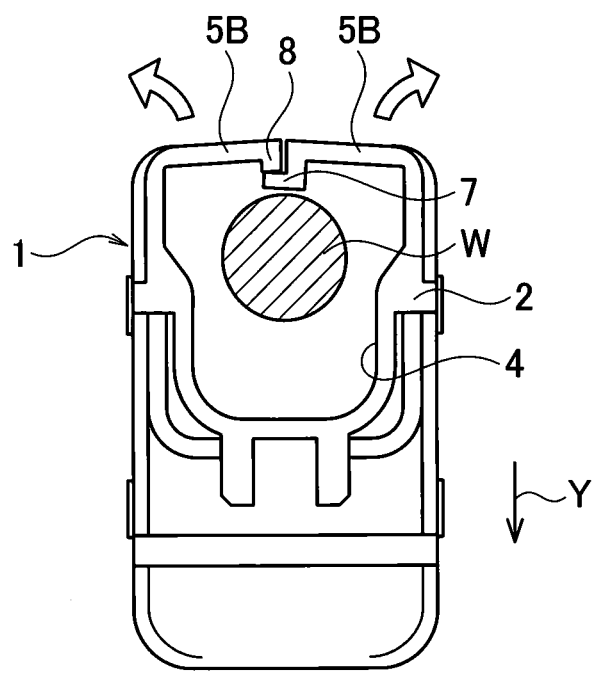
FIG. 17C is a side view showing a state in which temporary wire engaging pieces prevent the electrical wires received in the electrical wire protective cover from moving outside according to the fifth embodiment of the present invention.

When the electrical wire W is received in the wire receiving channel 4 in the assembling process, the electrical wire protective cover 1 is temporarily engaged with the electrical wire W since the pair of temporary wire retaining pieces 5B close the opening completely as shown in FIG. 17C. Furthermore, even if an external force that causes the electrical wire W received in the wire receiving channel 4 to produce outward bending deformation on the pair of temporary wire retaining pieces 5B is applied, both the engagement portions 7 and 8 of the pair of temporary wire retaining pieces 5B keep their engagement as shown in FIG. 17C and the pair of temporary wire retaining pieces 5B are not allowed to produce outward bending deformation, so that the electrical wire protective cover 1 is prevented from removing from the electrical wire W. Thus, the workability of assembly to the connector is further increased.

Since the pair of temporary wire retaining pieces 5B close the opening of the wire receiving channel 4 completely, the electrical wire protective cover 1 has excellent waterproofness and dustproofness.

Embodiments of the present invention have been described above. However, the invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

Moreover, the effects described in the embodiments of the present invention are only a list of optimum effects achieved by the present invention. Hence, the effects of the present invention are not limited to those described in the embodiment of the present invention.

What is claimed is:

1. An electrical wire protective cover to be assembled to a connector to cover an electrical wire pulled out of the connector, the electrical wire protective cover comprising:
   a cover body having a wire receiving channel with an opening along a wire extending direction of the electrical wire and opening toward a direction orthogonal to the wire extending direction and an axis of the electrical wire, the electrical wire insertable through the opening of the wire receiving channel into the wire receiving channel and accommodated therein; and
   a temporary wire retaining piece protruding from the cover body in a direction narrowing the opening of the wire receiving channel such that, in an undeformed state, the temporary wire retaining piece narrows the opening of the wire receiving channel to a dimension smaller than a width of the electrical wire, the temporary wire retaining piece being deformable between a first position and a second position, the first position where a bending deformation of the temporary wire retaining piece into an inside of the wire receiving channel allows the electrical wire to be inserted into the wire receiving channel, the second position where the temporary wire retaining piece narrows the opening of the wire receiving channel to the dimension smaller than the width of the electrical wire to prevent a movement of the electrical wire received in the wire receiving channel to an outside of the wire receiving channel in the direction orthogonal to the wire extending direction.

2. The electrical wire protective cover according to claim 1, wherein a pair of the temporary wire retaining pieces are provided on the cover body.

3. The electrical wire protective cover according to claim 2, wherein the pair of the temporary wire retaining pieces interfere with each other in a bending deformation to the outside of the wire receiving channel from the wire receiving channel.

4. The electrical wire protective cover according to claim 3, wherein the pair of the temporary wire retaining pieces have respective engagement portions at distal ends of the pair of the temporary wire retaining pieces and are configured to interfere with each other due to an engagement between the engagement portions in the bending deformation to the outside of the wire receiving channel from the wire receiving channel.

5. The electrical wire protective cover according to claim 1, wherein the temporary wire retaining piece is provided on one side of the cover body.

6. The electrical wire protective cover according to claim 5, wherein the single temporary wire retaining piece is configured to interfere with the cover body in a bending deformation to the outside of the wire receiving channel from the wire receiving channel.

7. The electrical wire protective cover according to claim 1, wherein the temporary wire retaining piece slopes in a direction entering an inside of the wire receiving channel.

8. The electrical wire protective cover according to claim 1, wherein the temporary wire retaining piece has a tapered surface where an end portion of the temporary wire retaining piece in the wire extending direction of the electrical wire gradually expands an opening toward a tip of the temporary wire retaining piece.

9. The electrical wire protective cover according to claim 1, wherein the cover comprises a connector assembling portion having a plurality of engagement holes to engage the connector.

10. The electrical wire protective cover according to claim 1, wherein the movement of the electrical wire received in the wire receiving channel to the outside of the wire receiving channel is prevented by the temporary wire retaining piece in the undeformed state.

11. The electrical wire protective cover according to claim 10, wherein
   the temporary wire retaining piece comprises a pair of temporary wire retaining pieces;
   a dimension of an opening between the pair of temporary wire retaining pieces in the undeformed state is smaller than the width of the electrical wire; and
   the movement of the electrical wire received in the wire receiving channel to an outside of the wire receiving channel is prevented by the pair of temporary wire retaining pieces in the undeformed state.

12. The electrical wire protective cover according to claim 11, wherein a temporary wire retaining piece of the pair of temporary wire retaining pieces is provided on both sides of the cover body.

13. The electrical wire protective cover according to claim 11, wherein the pair of temporary wire retaining pieces slope in a direction that enters the inside of the wire receiving channel.

14. The electrical wire protective cover according to claim 11, wherein an end portion in the wire extending direction of each of the pair of temporary wire retaining pieces is provided with a tapered surface that gradually expands from a center toward a tip of the end portion.

15. The electrical wire protective cover according to claim 11, wherein the pair of temporary wire retaining pieces interfere with each other during an outward bending deformation to prevent a bending deformation greater than a given extent.

16. The electrical wire protective cover according to claim 15, wherein trajectories of distal ends of each of the pair of temporary wire retaining pieces intersect during the outward bending deformation of the pair of temporary wire retaining pieces.

17. The electrical wire protective cover according to claim 1, wherein the temporary wire retaining piece is configured such that a distal end of the temporary wire retaining piece abuts on an inner surface of the cover body during an outward bending deformation of the temporary wire retaining piece from within the wire receiving channel.

18. The electrical wire protective cover according to claim 2, wherein distal ends of each piece of the pair of temporary wire retaining pieces comprise engagement portions forming a pair of engagement portions engaged with each other prior to a bending deformation of the pair of temporary wire retaining pieces such that the wire receiving channel is completely closed along the wire extending direction.

19. The electrical wire protective cover according to claim 18, wherein
- the pair of engagement portions engage with each other to prevent the pair of temporary wire retaining pieces from moving outside of the wire receiving channel; and
- the pair of engagement portions release from each other to enable the pair of temporary wire retaining pieces to open and move into the wire receiving channel.

20. The electrical wire protective cover according to claim 1, wherein the temporary wire retaining piece has a rounded surface defined as an outer surface of a connecting portion to the cover body.

\* \* \* \* \*